(12) United States Patent
Seo et al.

(10) Patent No.: US 7,564,755 B2
(45) Date of Patent: *Jul. 21, 2009

(54) METHOD AND APPARATUS FOR AUTOMATICALLY CONTROLLING OUTPUT OF LASER DIODE

(75) Inventors: Jin-gyo Seo, Gyeonggi-do (KR); Kyoung-bok Jin, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 344 days.

This patent is subject to a terminal disclaimer.

(21) Appl. No.: 11/399,645

(22) Filed: Apr. 7, 2006

(65) Prior Publication Data

US 2006/0181984 A1    Aug. 17, 2006

Related U.S. Application Data

(63) Continuation of application No. 09/991,632, filed on Nov. 26, 2001, now Pat. No. 7,072,262.

(30) Foreign Application Priority Data

Feb. 16, 2001    (KR) ................... 2001-7845

(51) Int. Cl.
    *G11B 11/00* (2006.01)
(52) U.S. Cl. .................... 369/53.26; 369/116
(58) Field of Classification Search ........... None
    See application file for complete search history.

(56) References Cited

U.S. PATENT DOCUMENTS 5,490,127 A    2/1996    Ohta et al.
5,586,098 A    12/1996   Nishida et al.
6,222,815 B1   4/2001    Nagano
6,317,405 B1   11/2001   Arai
6,341,117 B1   1/2002    Seo
6,731,586 B2   5/2004    Seo et al.
6,778,486 B1   8/2004    Arikawa et al.
6,781,934 B2   8/2004    Kim et al.

FOREIGN PATENT DOCUMENTS

JP    10-69664     3/1998
JP    11144288     5/1999
JP    11-250459    9/1999

OTHER PUBLICATIONS

U.S. Appl. No. 09/991,632, filed Nov. 26, 2001, Jin-gyo Seo et al., Samsung Electronics Co. Ltd.
Chinese Office Action for Application No. 20041000749223 issued Dec. 5, 2005.

*Primary Examiner*—Paul Huber
(74) *Attorney, Agent, or Firm*—Staas & Halsey LLP (57) ABSTRACT

A pickup of an optical reproducing/recording apparatus having a laser diode generating an optical signal with a current power value, and a laser diode power control device automatically controlling an output of the laser diode. The laser diode power control device has a sampler sampling the current power value of the optical signal from the laser diode, an operation unit outputting a target output value based on a comparison of the sampled current power value and a basic power value depending on a type of medium that is to receive the output of the laser diode, and a controller controlling the output of the laser diode based on the target output value.

9 Claims, 6 Drawing Sheets

METHOD AND APPARATUS FOR AUTOMATICALLY CONTROLLING OUTPUT OF LASER DIODE

CROSS-REFERENCE TO RELATED APPLICATIONS

This application is a continuation of application Ser. No. 09/991,632 filed Nov. 26, 2001, now U.S. Pat. No. 7,072,262 and also claims the benefit of Korean Patent Application No. 2001-7845 filed on Feb. 16, 2001, in the Korean Industrial Property Office, the disclosures of which are hereby incorporated by reference.

BACKGROUND OF THE INVENTION

1. Field of the Invention

The present invention relates to an optical recording/regenerating apparatus, and more particularly, to a method and an apparatus that automatically controls the optimum output of a laser diode.

2. Description of the Related Art

In the information-oriented or multimedia society we live in today, recording media accommodating a large amount of data is required. These recording media include CD-Rs, CD+RWs, magnetic optical disc drives (MODDs), digital versatile disc random access memories (DVD-RAMs), DVD-RWs, DVD+RWs, and the like. These recording media use laser diodes and thus control of the optimum output of the laser diodes determines their performances. Also, different types of recording media require different types of recording pulses, and therefore effective alternative methods of recording are required.

Figure 1:
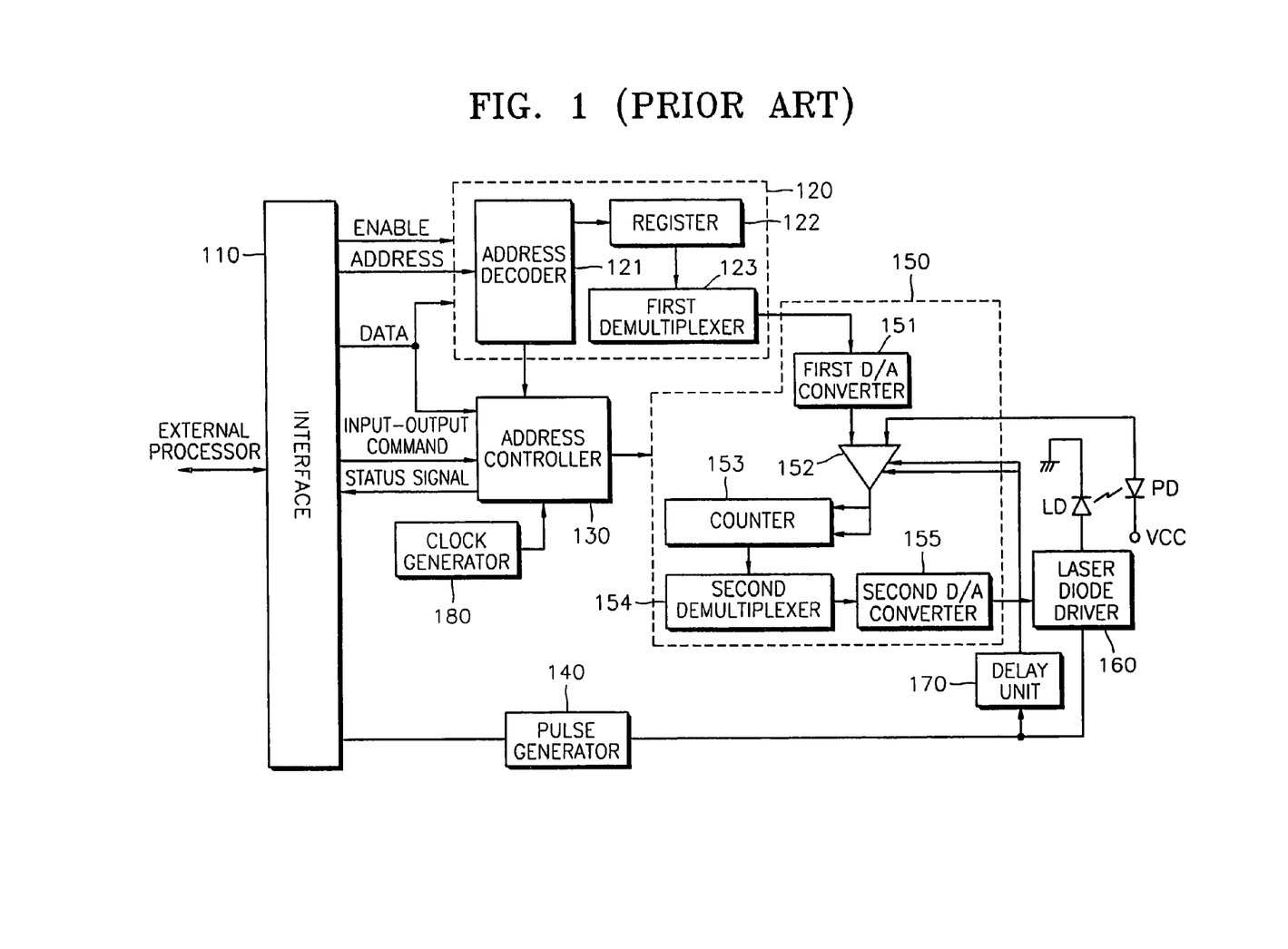
FIG. 1 is a block diagram illustrating the structure of a conventional apparatus for automatically controlling the output of a laser diode.

FIG. 1 shows a block diagram of a conventional apparatus that automatically controls the output of a laser diode. Referring to FIG. 1, the apparatus includes an interface 110, a decoder 120, an address controller 130, a pulse generator 140, an ALPC block 150, an LD driver 160, and a delay unit 170.

The interface 110 communicates with an outer processor, e.g., a microprocessor of a computer to transceive information on recording/regenerating data, control data, and modes used. The decoder 120 includes an address decoder 121, a register unit 122, and a demultiplexer 123 that selects one of a variety of registers included in the register unit 122. The address controller 130 can include a variety of registers and sub-blocks to realize the functions of the address controller 130. The laser diode driver 160 is a device switching at a high speed and may include generally-used ICs or ASICs.

The pulse generator 140 generates signals that in turn generate and control recording pulses to form a domain on a recording medium corresponding to data to be recorded. Delay unit 170 is for delay, LD represents a laser diode, and PD represents a photo diode.

The ALPC block 150 detects the difference between a basic power value from the decoder 120 and a current power value from the PD and controls the laser diode driver 160 based on the detected result.

The operation of the apparatus shown in FIG. 1 is described below. The interface 110 is not described specifically because its configuration depends on each optical disk unit.

The decoder 120 selects and keeps target power values, e.g., basic power values such as read power, eraser power, and peak power. At least three or more basic power values selected, e.g., read power, eraser power, and peak power, are input into the ALPC block 150. A first D/A converter 151 converts each basic power value to an analog signal value and transmits it to a comparator 152.

Meanwhile, a signal output from the PD is transmitted to the comparator 152 via a buffer (not shown). Here, the pulse generator 140 generates a signal, and then transmits this signal to the comparator 152 via the delay unit 170 to control the operation of the comparator 152.

An up/down counter 153 counts up or down based on the results of the comparator 152. The output of the up/down counter 153 is selected by a second demultiplexer 154, converted to an analog signal via a second D/A converter 155, and transmitted to the LD driver 160.

A control signal is input into the LD driver 160 to control each power level from the ALPC block 150 and each power level from the pulse generator 140.

In the apparatus shown in FIG. 1, the up/down counter 153 is used to compare and control the basic power values and the current power values fed back to the LD driver. However, since the speed of recording and regenerating media has increased significantly, the operating speed of the up/down counter 153 limits the control speed and range. Also, as the recording speed increases, the width of recording pulses gets narrower and more complicated.

SUMMARY OF THE INVENTION

Accordingly, it is an object of the present invention to provide a pickup of an optical reproducing/recording apparatus that automatically controls the output of a laser diode.

Additional objects and advantages of the invention will be set forth in part in the description which follows and, in part, will be obvious from the description, or may be learned by practice of the invention.

The foregoing objects of the present invention are achieved by providing a pickup of an optical reproducing/recording apparatus having: a laser diode generating an optical signal with a current power value; and a laser diode power control device automatically controlling an output of the laser diode, wherein the laser diode power control device has a sampler sampling the current power value of the optical signal from the laser diode, an operation unit outputting a target output value based on a comparison of the sampled current power value and a basic power value depending on a type of medium that is to receive the output of the laser diode, and a controller controlling the output of the laser diode based on the target output value.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 5(a)-5(h) provide a timing chart illustrating the operation of the apparatus shown in FIG. 4; and FIGS. 6(a)-6(e) provide a diagram of an operating mode of an operation unit shown in FIG. 4.

DETAILED DESCRIPTION OF THE PREFERRED EMBODIMENTS

Hereinafter, the structure and operation of an apparatus that automatically controls the output of a laser diode according to the present invention will be described in detail with reference to the attached drawings.

In the apparatus shown in FIG. 1, the up/down counter 153 is used to compare and control the basic power values and the current power values fed back to the LD driver 160. However, since the speed of recording and regenerating of media continues to increase, the operating speed of the up/down counter 153 limits controlling speed and range. Also, as the recording speed increases, the width of recording pulses gets narrower and more complicated. Thus, steps are required to be taken to solve these problems.

The present invention provides a method of automatically controlling the output of a laser diode by which the output of the laser diode is sampled and held for a desired period at a desired location and then compared with basic power values.

Figure 2:
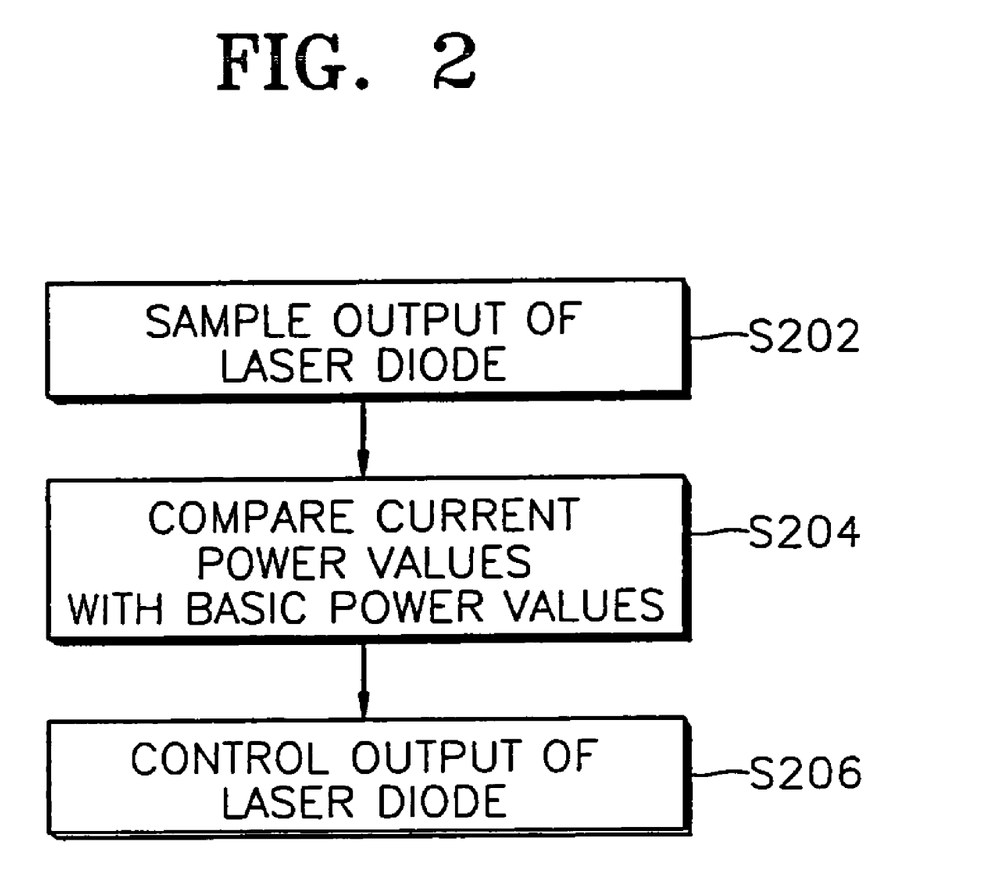
FIG. 2 is a flowchart illustrating a method of automatically controlling the output of a laser diode according to the present invention.

FIG. 2 is a flowchart showing a method of automatically controlling the output of an auto laser diode according to the present invention. The method shown in FIG. 2 includes a sampling and holding operation S202, a comparing operation S204, and a controlling operation S206. In the sampling and holding operation S202, the output of the laser diode is sampled and held. In the comparing operation S204, current power values and basic power values of the laser diode sampled in the sampling and holding operation S202 are compared with each other, and then the differences between them are obtained. In the controlling operation S206, the output of the laser diode is controlled based on the value differences obtained from the comparing operation S204.

Since the conventional apparatus shown in FIG. 1 uses an up/down counter while the method shown in FIG. 2 does not use an up/down counter, the responsive speed that controls the output of the laser diode increases. Thus, the method shown in FIG. 2 is applied to recording media of high density and capacity.

Figure 3:
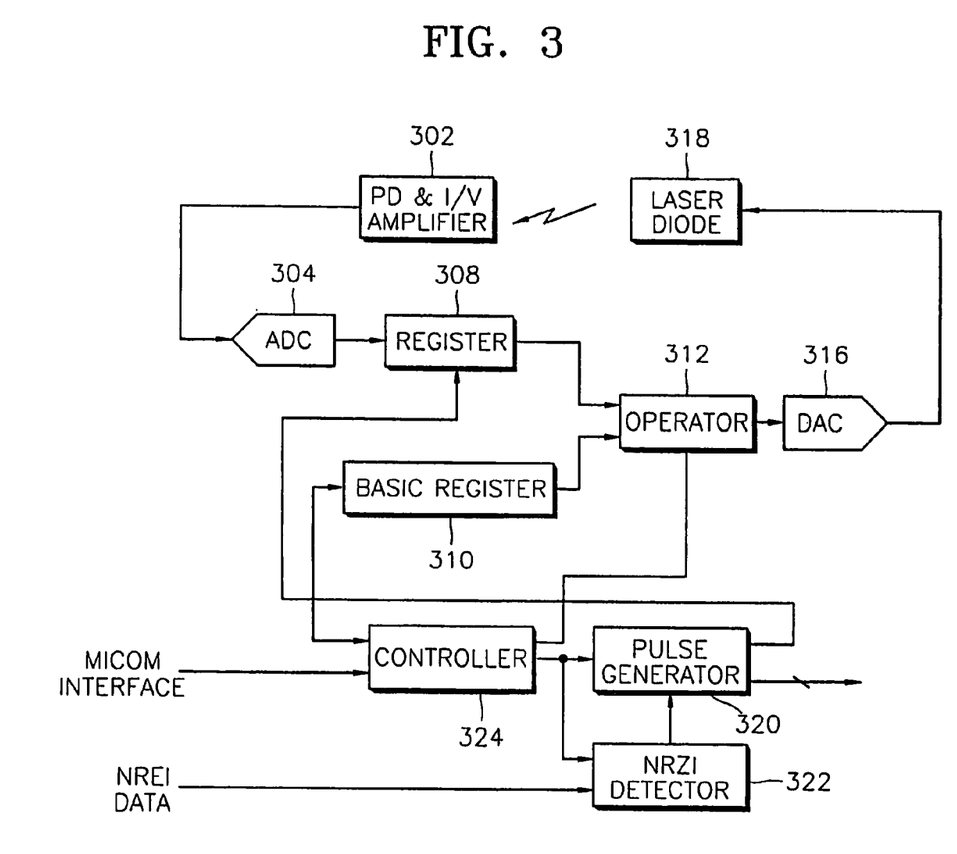
FIG. 3 is a block diagram illustrating the structure of an apparatus to automatically control the output of the laser diode according to the present invention.

FIG. 3 is a block diagram of the structure of an apparatus that automatically controls the output of a laser diode according to the present invention. Referring to FIG. 3, the apparatus includes a photo diode (PD) & I/V amplifier 302, an analog/digital converter 304, a register unit 308, a basic register unit 310, an operator unit 312, a digital/analog converter 316, a laser diode 318, a pulse generator 320, an NRZI detector 322, and a controller 324.

The output of the laser diode 318 is controlled by the digital/analog converter 316 and the output level thereof is detected and current-to-voltage-converted by the PD & I/V amplifier 302. In this case, one chip comprising of the PD & I/V amplifier 302 is used. However, a photo diode and an I/V amplifier separate from each other can be used alternatively. The output of the PD & I/V amplifier 302 indicates the current power value of the laser diode 318 and has delayed waveforms of recording pulses applied to the laser diode 318. Here, the delayed amount depends on the operating characteristics of the laser diode 318 and the PD & I/V amplifier 302, and is rarely changed after the configuration of the apparatus.

The recording pulse is a multi-pulse including a first pulse, a multi-pulse train, a last pulse, and a cooling pulse. Each pulse has any one of read power level, peak power level, bias 1 power level, bias 2 power level, and bias 3 power level. In other words, the level of the recording pulse is changed over time and becomes any one of the read power level, the peak power level, the bias 1 (or erase) power level, the bias 2 (or cooling) power level, and the bias 3 (or bottom) power level as time elapses.

The recording pulse is made on the basis of a non-return-to-zero inverted (NRZI) signal. The rising/falling position, width, and power level of each pulse constituting the recording pulse are changed based on the interrelation between front and back spaces of a current mark.

The pulse generator 320 generates a power level control signal turning on/off each power level based on the NRZI signal and the interrelation between the spaces of the current mark. The power level control signal includes a lead control signal, a peak control signal, a bias 1 control signal, a bias 2 control signal, and a bias 3 control signal each controlling the read power level, the peak power level, the bias 1 power level, the bias 2 power level, and the bias 3 power level.

The analog/digital converter 304 samples the output of the PD & IV amplifier 302 at a predetermined point, obtains current power values, and transmits them to the operator unit 312 via the register unit 308.

The operator unit 312 compares the sampled current power values with the basic power values and controls the output of the laser diode 318 based on the compared results. Here, the basic register stores a value, which is output from the controller 324 when the apparatus shown in FIG. 3 is initialized, and the stored value depends on the types of media. In detail, the operator unit 312 changes the level of driving power which is supplied to the laser diode 318, based on the compared results.

Figure 4:
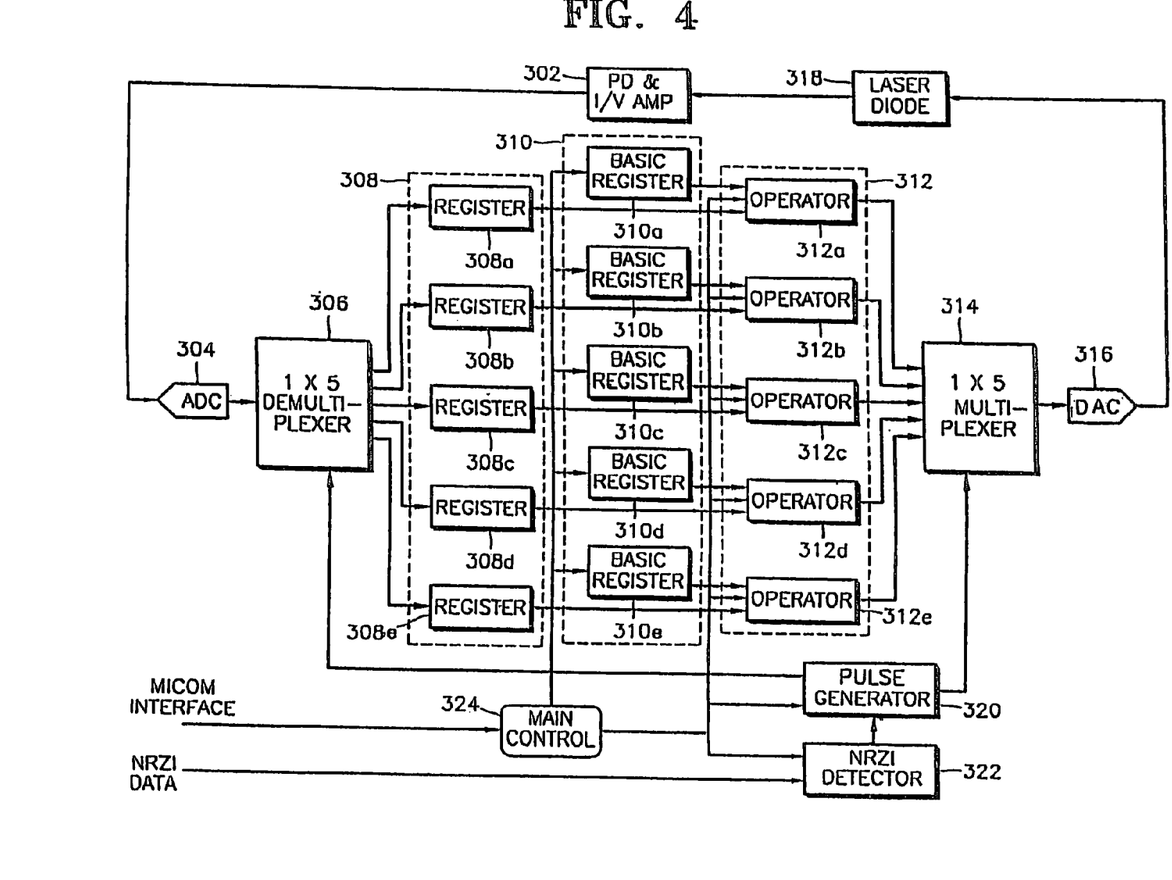
FIG. 4 is a block diagram describing an embodiment of the apparatus that automatically controls the output of the laser diode according to the present invention.

FIG. 4 is a block diagram of an apparatus according to the present invention that automatically controls a laser diode. The components of the apparatus shown in FIG. 4 that have the same reference numerals as those of the apparatus shown in FIG. 3 have the same operating functions and thus a detailed description will be omitted. In FIG. 4, the solid lines represent the flow of data and control signals, and the broken line boxes represent the register unit 308, the basic register unit 310, and the operator unit 312, respectively. The apparatus shown in FIG. 4 includes a photo diode (PD) & I/V amplifier 302, an analog/digital converter 304, a demulitplexer 306, a register unit 308, a basic register unit 310, an operator unit 312, a multiplexer 314, a digital/analog converter 316, a laser diode 318, a pulse generator 320, an NRZI detector 322, and a controller 324.

The basic register unit 310 stores a basic power value output from the controller 324. The basic power value depends on the format of the disk, e.g., CD, CD-R, DVD, DVD-RW, and DVD+RW, the types of media, and makers, and is transmitted to the controller 324 via an interface (not shown).

The output of the PD & I/V amplifier 302 represents the current power value of the laser diode 318. The PD & I/V amplifier 302 is a variable gain amplifier, and the gain is set depending on operating modes and the existence of land/grooves on the disc.

The analog/digital converter 304 corresponds to a sampler, sampling the current power value of the optical signal output from the laser diode, as disclosed in the summary of the present invention, and converts the output of the PD & I/V amplifier 302 to an analog/digital signal. The output of the analog/digital converter 304 is transmitted to the operation unit 312 via the demultiplexer 306 and the register unit 308.

The pulse generator 320 generates a demultiplexing control signal controlling the operation of the demultiplexer 306. The pulse generator 320 includes a plurality of delay units and gates (not shown), delays and logically operates a power level control signal, and generates a multiplexing control signal transmitted to the multiplexer 314 as well as generating a demultiplexing control signal transmitted to the demultiplexer 306.

It can be easy to select a sector to sample a desired power level from the laser diode 318 using the delay units and the gates.

Meanwhile, the pulse generator 320 generates a lead control signal, a peak control signal, a bias 1 control signal, a bias 2 control signal, and a bias 3 control signal, and the NRZI detector 322 determines the rising/falling positions of these signals and the width of their pulses.

The NRZI detector 322 receives an NRZI signal, detects the interrelation between the current mark and the front and back spaces of the mark, and transmits the detected results to the pulse generator 320, thereby determining the rising/falling position of each control signal and the width of their pulses.

The controller 324 transmits the basic power values received via the interface (not shown) to the basic register unit 310, and controls the gain of the PD & I/V amplifier 302 based on information on operating modes, types of media, formats of disks, and the existence of a land/groove on the disc.

A detailed description of the operation of the apparatus shown in FIG. 4 is as follows. Auto power control of a laser diode means that the power of a laser is controlled when recording/regenerating on optical discs. Since the output of the laser varies based on temperature, the output of the laser needs to be uniformly controlled based on operating temperature. This is called an auto laser output control. The power of a laser diode is automatically controlled to stabilize the output of the laser based on temperature variation, and to prevent the deterioration of recording based on heat accumulation in a multitrain recording method.

The NRZI detector 322 receives NRZI data and detects data to be recorded. The NRZI detector 322 detects the predetermined interrelation between the current mark and the front and back spaces of the current mark, and outputs the detected results to the pulse generator 320. In an adaptive control method, the length of a current mark and the combination of spaces are classified into a few groups based on the lengths of the mark and spaces. The classified groups each have different power levels, rising/falling positions, and widths of the pulses, which constitute recording pulses. Also, the power levels of the pulses vary based on the energy of the NRZI signal. Here, the energy represents the number exchanged between 0 and 1 for a unit time.

Figure 5:
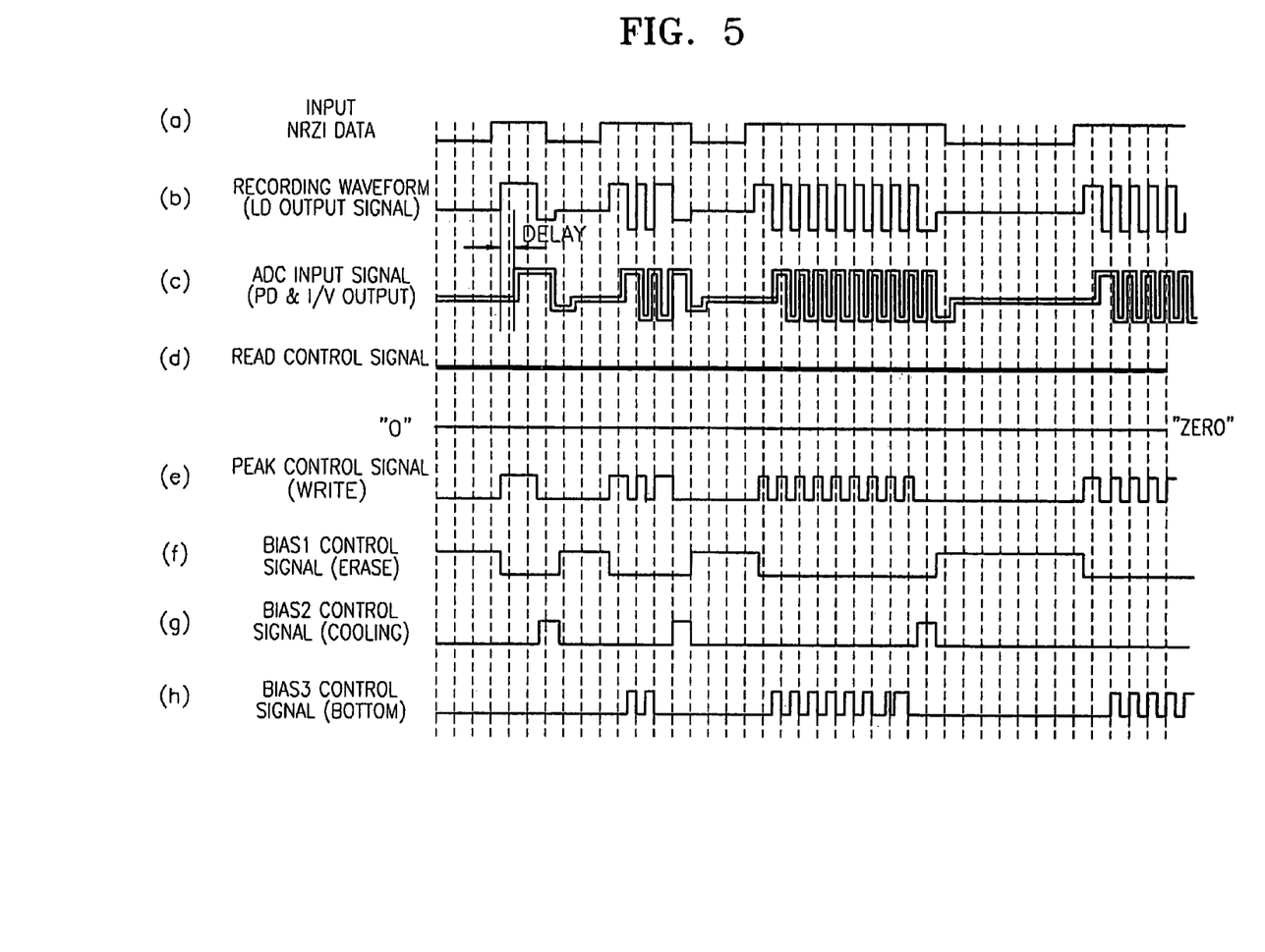

The pulse generator 320 generates power level control signals (FIGS. 5(c)-5(f)) that form recording pulses (shown in FIG. 5(b)) appropriate for the detected results of the NRZI detector 322, the laser diode from the controller 324, the different types of media and recording speed.

The analog/digital converter 304 samples the output of the PD & I/V converter 302, and then the output of the analog/digital converter 304 is transmitted to the register unit 308 via the demultiplexer 306.

The register unit 308 includes registers 308a through 308e corresponding to the power required to control the output of the laser diode. For example, a 2.6 Gbyte DVD needs three power levels of read power, peak power, and bias power, and a 4.7 Gbyte DVD needs five power levels of a read power, a peak power, a bias 1 power (erase power), a bias 2 power (cooling power), and a bias 3 power (bottom power).

The storing operations of the registers 308a through 308e are synchronized with the demultiplexing control signal.

The basic register unit 310 and the operator unit 312 each include basic registers 310a through 310e and operators 312a through 312e corresponding to the number of the registers 308a through 308e of the register unit 308.

The operators 312a through 312e of the operation unit 312 compare the current power values stored in the operators 312(a)-312(e) with the basic power values stored in the basic registers 310a through 310e based on operation modes determined by the controller 324, and controls the power level of the laser diode 318 based on the compared results through the demultiplexer 314 and the digital/analog converter 316.

The outputs of the operators 312a through 312e of the operator unit 312 drive the laser diode 318, and the output level of the laser diode 318 is fed back to the analog/digital converter 304 via the PD & I/V amplifier 302.

Compared with the conventional up/down counter, which increases/decreases the target value by one bit, the apparatus shown in FIG. 4 increases/decreases all of the bits at the same time, thereby increasing the speed of tracking. Thus, the apparatus shown in FIG. 4 can efficiently control the laser power based on the types of media and recording speed.

The registers of the register unit 308, the basic registers of the basic register 310, and the operators of the operator unit 312 are provided depending on the required number of power levels, and five power levels of the read power, the peak power, the bias 1 power, the bias 2 power, and the bias 3 power are used in FIG. 3.

FIGS. 5(a)-5(h) are waveform diagrams showing the operation of the apparatus in FIG. 4. FIGS. 5(a) and 5(b) waveforms represent an input NRZI signal and recording pulses output from the laser diode, respectively. The waveforms of the recording pulses vary based on the types of media, recording speed, and disc makers. These recording pulses are an example of a 4.7 GByte DVD_RAM, and the waveforms of recording pulses also vary based on the interrelation between a current mark and space.

Waveform 5(c) represents a signal input to the analog/digital converter 304 from the PD & I/V amplifier 302. In other words, a portion of an optical signal output from the laser diode 318 is input to a photo diode (PD), and the output of the photo diode (PD), i.e., a current value, is converted to a voltage signal and simultaneously amplified to an appropriate gain. Thus, the optical power value output from the laser diode 318 can be obtained by detecting the signal.

Waveform 5(d) represents a control signal that controls the read power level, waveform 5(e) represents a control signal that controls the peak power level, waveform 5(f) represents a control signal that controls the erase power level, waveform 5(g) represents a control signal that controls the cooling power level, and waveform 5(h) represents a control signal that controls the bottom power level. Recording pulses such as 5(b) can be generated from the combination of the control signals shown in 5(d), 5(e), 5(f), and 5(g).

Figure 6:
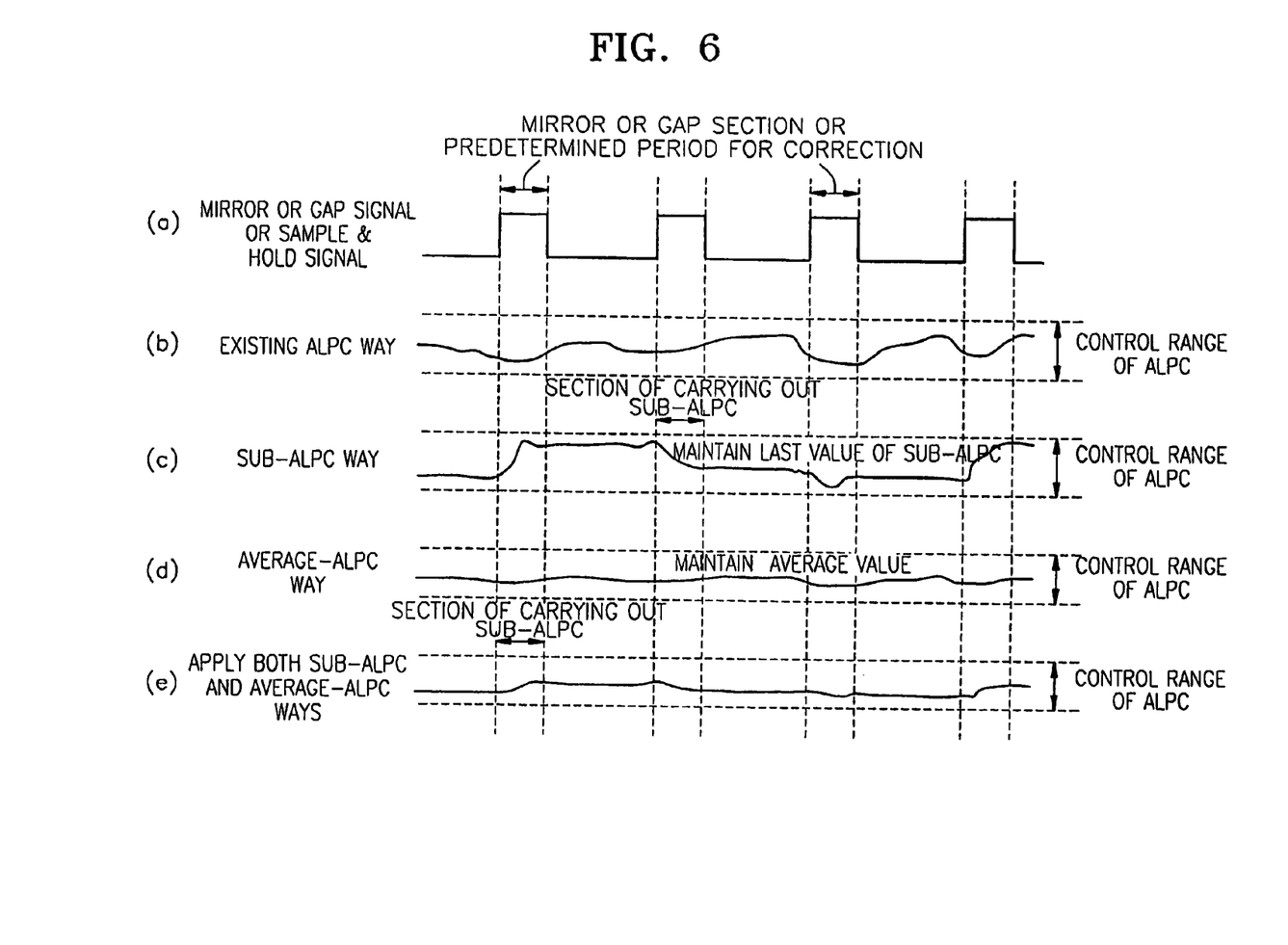

FIGS. 6(a)-6(e) show the operation modes of the operation unit 312 shown in FIG. 4. The mirror or gap sector in waveform 6(a) is generated when using DVD-RAMs, and others represent unused sectors or sectors maximally/minimally controlling a focus servo. Continuous control is performed in the mode provided in FIG. 6(b), and at this time, optical power may be changed due to sampling noise or outside noise. In the case of the mode provided in FIG. 6(c), a particular sector, such as the mirror or gap section in FIG. 6(a), is controlled, and other sectors are held at the last controlled value. As a result, variations in optical power (sub-ALPC mode) are reduced. In the case of the mode provided in 6(d), each controlled value is not reflected but averaged, and then the averaged value is reflected, thereby reducing variations in optical power (Average ALPC mode). Here, the same effect as that exhibited when using a low-pass filter can be obtained.

In the case when performing the mode provided in 6(*e*), the modes provided in 6(*b*) and 6(*d*) are simultaneously used, variations in average are reflected in a particular sector, and the last value is held in other sectors, thereby minimizing variations in optical power due to sampling noise or outside noise.

The apparatus shown in FIG. 4 serves as both an apparatus that automatically controls the output of a laser and a driver that drives a laser diode. The apparatuses shown in FIG. 4 may be installed in a pickup, as shown in the apparatus of FIG. 4, and in this case where it is built into the pickup, the limit in the speed of an interface can be eliminated and the number of parts needed for the interface can be reduced.

In general, since the output of a photo diode is a minute signal, it is easily affected by the influx and interference of noise during interfacing. However, in a case where the photo diode is installed on a pickup as shown in FIG. 4, the influx and interference of noise can be prevented.

Accordingly, the apparatus that automatically controls the output of a laser diode according to the present invention can be effectively adapted to an optical recording/regenerating apparatus of high speed and high capacity, and can be attributed to the performance improvement and downsizing of the optical recording/reproducing apparatus.

Although preferred embodiments of the present invention have been shown and described, it will be appreciated by those skilled in the art that changes may be made in these embodiments without department from the principle and spirit of the invention, the scope of which is defined in the appended claims and their equivalents.

What is claimed is:

1. A pickup of an optical reproducing/recording apparatus comprising:
   a laser diode generating an optical signal with a current power value; and
   a laser diode power control device automatically controlling an output of the laser diode, wherein the laser diode power control device comprises
      a sampler sampling the current power value of the optical signal from the laser diode,
      an operation unit outputting a target output value based on a comparison of the sampled current power value and a basic power value depending on a type of medium that is to receive the output of the laser diode, and
      a controller controlling the output of the laser diode based on the target output value.

2. The apparatus of claim 1, wherein the laser diode power control device further comprises:
   a registering unit storing the output of the sampler prior to being received by the operation unit; and
   a basic register unit storing the basic power value prior to being received by the operation unit.

3. The pickup of claim 1, wherein the sampler holds the sampled current power prior to the comparing.

4. The pickup of claim 1, wherein the basic power value is based on a format of the medium and a maker of the medium.

5. The pickup of claim 2, wherein the sampled current power value comprises a first plurality of bits, and the stored basic power value comprises a second plurality of bits, and the operation unit simultaneously compares ones of the first plurality of bits with corresponding ones of the second plurality of bits to generate the target output value.

6. The pickup of claim 2, wherein the stored sampled current power value comprises a first plurality of bits, and the stored basic power value comprises a second plurality of bits, and the operation unit simultaneously comparing ones of the first plurality of bits with corresponding ones of the second plurality of bits to generate the target output value.

7. The pickup of claim 6, wherein the first plurality of bits are indicative of a read power, a peak power and a bias power.

8. The pickup of claim 6, wherein the first plurality of bits are indicative of a read power, a peak power and a bias power of a sector of a medium which is to receive the output of the laser diode.

9. The pickup of claim 6, wherein the first plurality of bits are indicative of a read power, a peak power, an erase power, a cooling power and a bottom power of a sector of a medium which is to receive the output of the laser diode.

* * * * *